United States Patent
Shin et al.

[11] Patent Number: 6,083,808
[45] Date of Patent: Jul. 4, 2000

[54] METHOD FOR FORMING A TRENCH ISOLATION IN A SEMICONDUCTOR DEVICE

[75] Inventors: Yu-Gyun Shin, Seoul; Han-Sin Lee, Kyunggi-do; Tai-su Park, Kyunggi-do; Moon-Han Park, Kyunggi-do, all of Rep. of Korea

[73] Assignee: Samsung Electronics Co., Ltd., Suwon, Rep. of Korea

[21] Appl. No.: 09/160,094

[22] Filed: Sep. 25, 1998

[30] Foreign Application Priority Data

Sep. 25, 1997 [KR] Rep. of Korea ............ 97-48828

[51] Int. Cl.[7] .................................. H01L 21/76
[52] U.S. Cl. .................. 438/435; 438/424; 438/437; 148/DIG. 50
[58] Field of Search .................. 438/424, 435, 438/427, 437, 296; 148/DIG. 50

[56] References Cited

U.S. PATENT DOCUMENTS 5,478,762 12/1995 Chao .
5,665,635 9/1997 Kwon et al. ............ 438/424
5,741,740 4/1998 Jang et al. ............ 438/424
5,942,858 2/1996 Bose et al. ............ 148/DIG. 50
5,985,735 11/1999 Moon et al. ............ 438/435

*Primary Examiner*—Trung Dang
*Attorney, Agent, or Firm*—Jones Volentine, L.L.P.

[57] ABSTRACT

A method for forming a trench isolation in a semiconductor device is provided in which a first heat treatment process is conducted on a thermal oxide layer previously formed in a trench at temperature range from about 1000° C. to 1200° C. for about 1 to 8 hours so as to remove defects in a semiconductor substrate and oxygen impurities within the semiconductor substrate resulting from a step of forming the trench in the semiconductor substrate. As a result, a subsequent second heat treatment process for densifying a trench filling material such as a CVD oxide layer can be performed at lower temperature of about 1000° C. to 1050° C., as compared with the temperature of the first annealing of the thermal oxide layer, thereby reducing distortions of the semiconductor substrate and reducing current leakages.

13 Claims, 6 Drawing Sheets

METHOD FOR FORMING A TRENCH ISOLATION IN A SEMICONDUCTOR DEVICE

This application relies for priority upon Korean Patent Application No. 97-488288, filed on Sep. 25, 1997, the contents of which are herein incorporated by reference in their entirety.

FIELD OF THE INVENTION

The present invention relates to a method for fabricating a semiconductor device, and more particularly to a method for forming a trench isolation.

BACKGROUND OF THE INVENTION

As the density of integrated circuits increases, the dimension between individual devices becomes increasingly small. With this trend, the conventional LOCOS (local oxidation of silicon) method for isolating a device, which forms a field oxide layer via thermal oxidation technique, confronts the limit in the effective isolation length, thereby degrading characteristics of the electrical device isolation. Furthermore, the conventional LOCOS method possesses some inherent drawbacks resulting from the processes, i.e., lateral oxidation of the silicon underneath the silicon nitride mask, making the edge of the field oxide resemble the shape of a bird's beak.

According to the disadvantage for LOCOS isolation structures mentioned above, an isolation technique using shallow trenches has been developed. Generally, the shallow trench isolation (hereinafter referred to as "STI") includes the steps of etching a silicon substrate to form a trench, depositing a CVD (chemical vapor deposition) oxide layer to fill up the trench, and planarizing the CVD oxide layer.

According to the above-mentioned STI technique, the semiconductor substrate is etched at a predetermined depth, thereby providing excellent characteristics of the device isolation. Furthermore, the field oxide layer is formed via a CVD technique, so that the device isolation region that is defined by a photolithography process can be maintained throughout.

However, the STI technique possesses has some drawbacks. Etching the semiconductor substrate produces a damaged layer; an oxidation of the trench produces a stress; and the difference in a coefficient of thermal expansion between the CVD oxide layer and the semiconductor substrate produces a thermal stress during the step of densifying the CVD oxide layer via thermal treatment. Such drawbacks can result in a leakage source, thereby producing more junction current leakages compared with conventional LOCOS techniques.

To overcome the above problems, i.e., to reduce the junction current leakages, a method is proposed wherein the step of densifying the CVD oxide layer is performed at temperature about 1050° C. to 1150° C. so as to cure the damaged layer, thereby reducing the junction current leakages.

FIG. 1 to FIG. 3 are graphs showing the relationship between the current leakage and the distribution respectively in $n^+/p$, $n^-/p$, and $p^+/n$ junctions measured at a temperature of about 83° C., in accordance with a conventional method.

In FIG. 1 to FIG. 3, the circles 2a, 4a, and 6a show the relationship between the current leakage and the distribution in the case that the densifying of the CVD oxide layer is performed at temperature about 1050° C. and the squares 2b, 4b and 6b show the relationship between the current leakage and the distribution in the case that the densifying of the CVD oxide layer is performed at temperature about 1150° C.

Referring to FIG. 1, in case of an $n^+/p$ junction, the distribution of the current leakage is illustrated by circles 2a under the densifying temperature about 1050° C., and the distribution of the mean current leakage (50%) is about $4.7 \times 10^{-14}$ A/$\mu$m. On the other hand, the distribution of the current leakage is illustrated by squares 2b under the densifying temperature about 1150° C., and the distribution of the mean current leakage (50%) is about $3.5 \times 10^{-14}$ A/$\mu$m.

Referring to FIG. 2, in case of an $n^-/p$ junction, the distribution of the mean current leakage (50%) is about $4.5 \times 10^{-14}$ A/$\mu$m, as illustrated by circles 4a under the densifying temperature about 1050° C. On the other hand, the mean leakage (50%) is about $3.5 \times 10^{-14}$ A/$\mu$m, as illustrated by squares 4b under the densifying temperature about 1150° C.

Referring to FIG. 3, in the case of a $p^+/n$ junction, the distribution of the mean current leakage (50%) is about $3.3 \times 10^{-14}$ A/$\mu$m, as illustrated by circles 6a under the densifying temperature about 1050° C. On the other hand, the mean leakage (50%) is about $2.7 \times 10^{-14}$ A/$\mu$m, as illustrated by squares 6b under the densifying temperature about 1150° C.

As illustrated above, we can deduce that as the densifying temperature increases from about 1050° C. to about 1150° C., the junction current leakages reduces in each case.

However, as disclosed in U.S. Pat. No. 5,478,762, "METHOD FOR PRODUCING PATTERNING ALIGNMENT MARKS IN OXIDE", 1995, by Ying-Chen Chao et al., distortions of the semiconductor substrate can occur if the step of densifying the CVD oxide layer is performed at a high temperature of about 1150° C. or more, and the situation can be even worse when the CVD oxide layer is deposited thickly.

Furthermore, if the densifying the CVD oxide layer is performed at temperature of about 1150° C. or more, a step between an active region and inactive region occurs, thereby degrading characteristics of a subsequent gate oxide layer.

Therefore, a method is needed which not only can reduce the current leakage but which can also reduce the distortions of the semiconductor substrate in the art for forming trench isolation.

SUMMARY OF THE INVENTION

The present invention is intended to solve the problems, and it is an object of the invention to provide a method for forming a trench isolation that cures a damaged layer and removes oxygen impurities to form a denuded zone, thereby reducing current leakages.

It is a further object of the invention to provide a method for forming a trench isolation that prevents distortions of a semiconductor substrate.

It is yet another object of the invention to provide a method for forming a trench isolation that prevents the degrading of the characteristics of a gate oxide layer The above and other objects in accordance with the present invention may be realized by sequentially forming a silicon oxide layer and a silicon nitride layer on a semiconductor substrate. A photo-resist layer that defines a trench forming region is then deposited over the silicon nitride layer. The silicon nitride layer and the silicon oxide layer are then sequentially etched using the photo-resist layer as a mask, thereby exposing portions of the semiconductor substrate. Exposed portions of the semiconductor are etched to form a trench, preferably at a thickness of about about 0.1 $\mu$m to 1 $\mu$m.

A thermal oxide layer is then grown in the trench via a thermal oxidation process to a thickness of about 100 Å to 500 Å. The thermal oxide covers the bottom and sidewalls of the trench. A first heat treatment is then conducted on the semiconductor substrate to remove the substrate defects and oxygen impurities. This process is preferably performed in either a pure nitrogen or pure argon ambient atmosphere at a temperature of about 1000° C. to 1200° C. for about 1 to 8 hours.

A trench fill layer is then formed over the semiconductor substrate to a thickness that can withstand a planarization process. A second heat treatment for densifying the trench fill layer is conducted at a temperature of preferably about 1000° C. to 1050° C. and then the trench fill layer is planarized.

In accordance with the present invention, the step of first heat treatment is performed before forming the step of filling the trench layer, thereby removing the substrate defect and oxygen impurities and lowing the temperature of the densifying the trench fill layer. As a result, distortions of the semiconductor substrate can be prevented and the junction current leakage can be reduced.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENT

The preferred embodiment of the present invention will now be described with reference to the accompanying drawings.

FIG. 4A to FIG. 4F are flow diagrams showing a novel method for forming a trench isolation in a semiconductor substrate in accordance with a preferred embodiment of the present invention.

Figure 1:
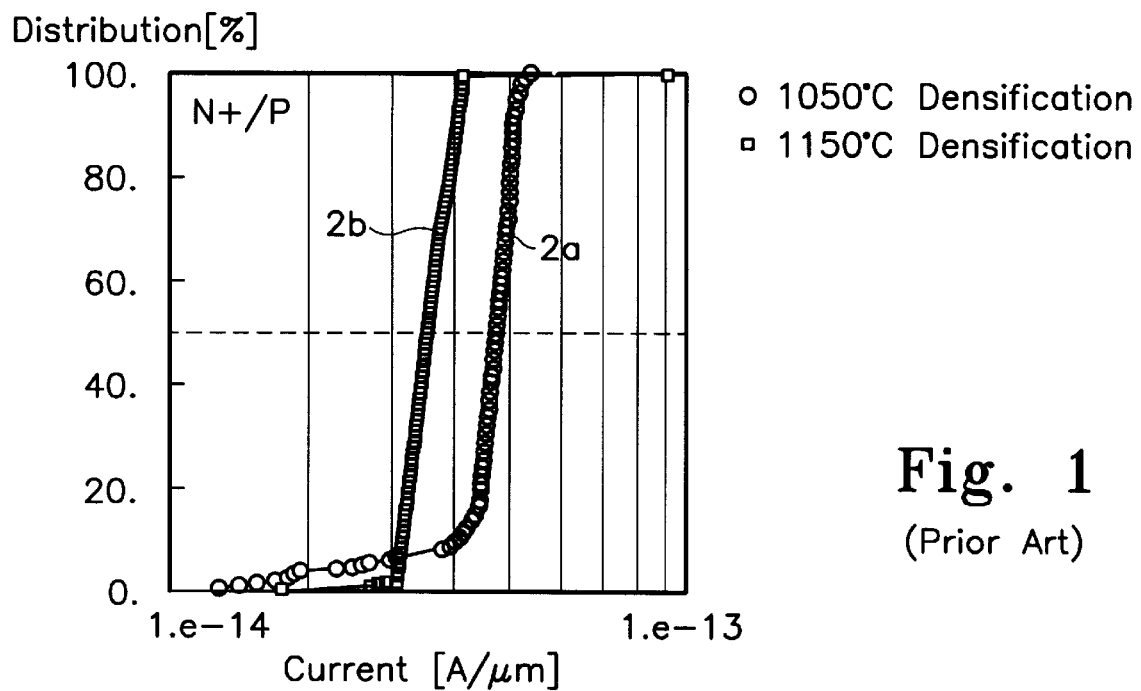
FIG. 1 is a graph showing the relationship between the current leakage and the distribution respectively in an $n^+/p$ junction measured at a temperature of about 83° C., in accordance with a conventional method.
Figure 2:
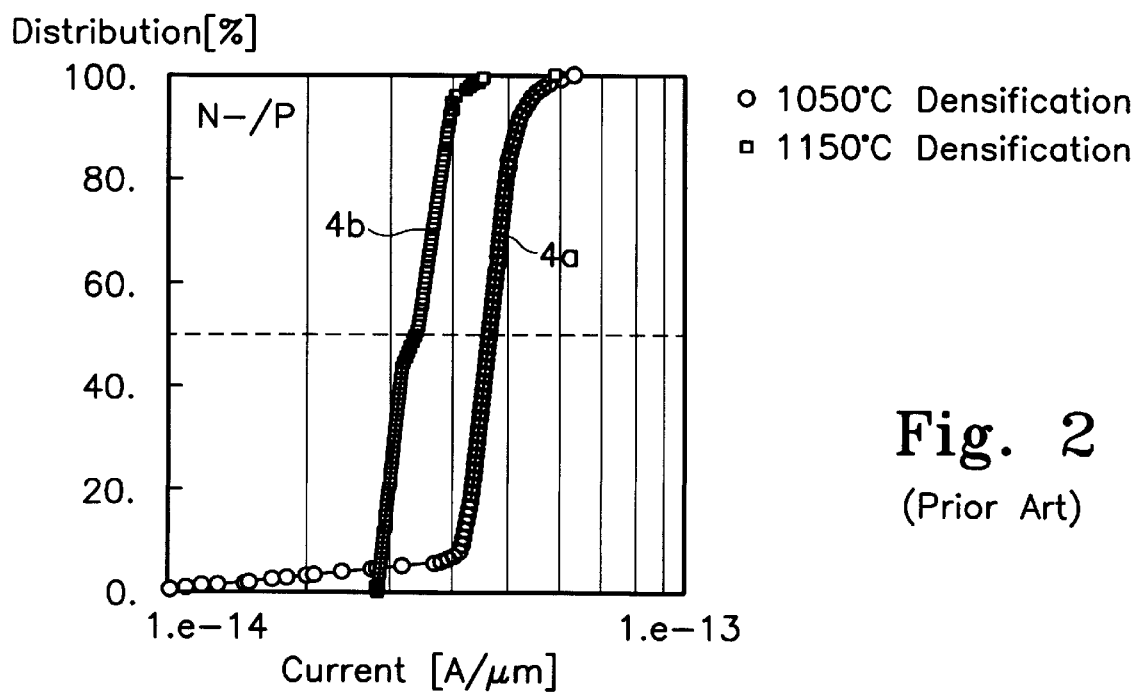
FIG. 2 is a graph showing the relationship between the current leakage and the distribution respectively in an $n^-/p$ junction measured at a temperature of about 83° C., in accordance with a conventional method.
Figure 3:
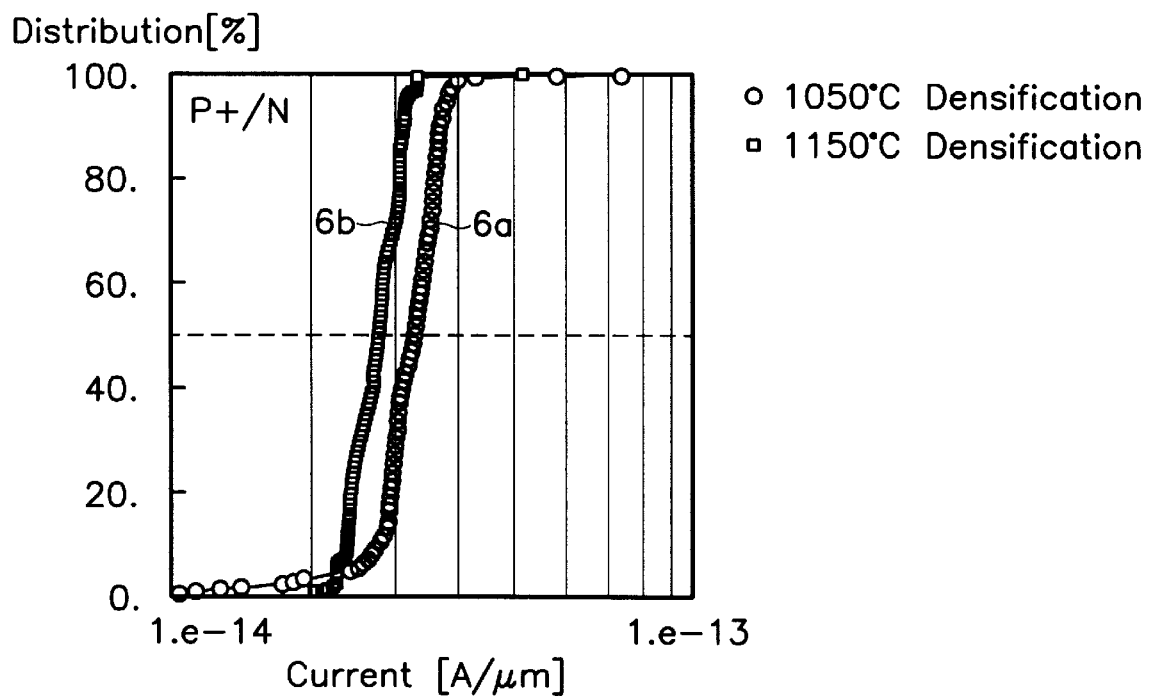
FIG. 3 is a graph showing the relationship between the current leakage and the distribution respectively in a $p^+/n$ junction measured at a temperature of about 83° C., in accordance with a conventional method.
Figure 4A:
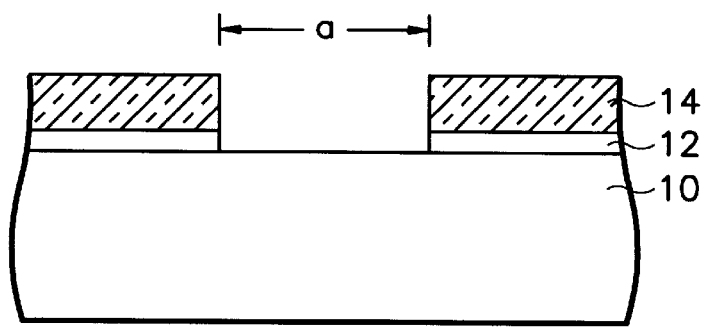
FIG. 4A to FIG. 4F are flow diagrams showing a novel method for forming a trench isolation in a semiconductor substrate in accordance with a preferred embodiment of the present invention.

Referring to FIG. 4A, a silicon oxide layer 12 is formed over a semiconductor substrate 10. A silicon nitride layer 14 is then formed over the silicon oxide layer 12. The silicon oxide layer 12 is preferably formed to a thickness of about 50 Å to 300 Å through thermal oxidation and the silicon nitride layer 14 is preferably formed to a thickness of about 500 Å to 3000 Å through a conventional LPCVD (low pressure chemical vapour deposition) method. The silicon oxide layer 12 disposed between the silicon nitride layer 14 and the semiconductor substrate 10 serves as a buffering layer which buffers stress between these two layers, and the silicon nitride layer 14 serves as an etching-stopping layer during a subsequent planarization process.

Figure 4B:
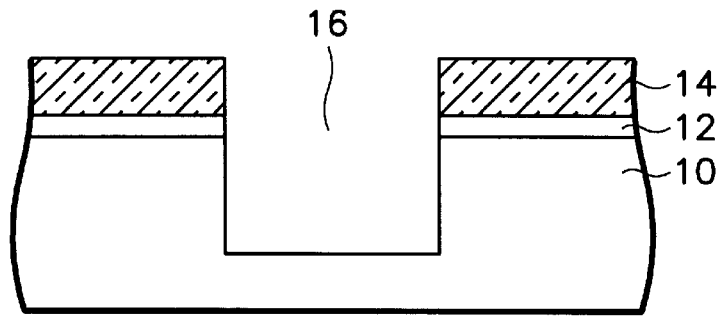

A photo-resist layer pattern (not shown) that defines a device isolation region (a) is then formed over the silicon nitride layer 14. The silicon nitride layer 14 and the silicon oxide layer 12 are sequentially etched using the photo-resist layer pattern as a mask, thereby exposing portions of the semiconductor substrate 10 within the device isolation region (a). The photo-resist layer pattern is then removed and the exposed portions of the semiconductor substrate 10 is etched, thereby forming a trench 16 using the silicon nitride layer 14 and the silicon oxide layer 12 as a mask, as shown in FIG. 4B. The trench 16 preferably has a depth of about 0.1 to 1 μm.

Another way to form the trench 16 is to first etch the silicon nitride layer 14 and the silicon oxide layer 12 using the photo-resist layer pattern as a mask, thereby exposing portions of the semiconductor substrate 10. The exposed portions of the semiconductor substrate 10 can then be etched, to form the trench 16 using the photo-resist layer as a mask, after which the photo-resist layer pattern is removed.

Alternatively, another silicon oxide layer (not shown) may be farther formed on the silicon nitride layer 14 and then patterned by a photolithography process, thereby exposing portions of the semiconductor 10. The exposed portions of the semiconductor substrate 10 can then be etched, to forming the trench 16 using the other silicon oxide layer including the underlying layers 14 and 12 as a mask.

Figure 4C:
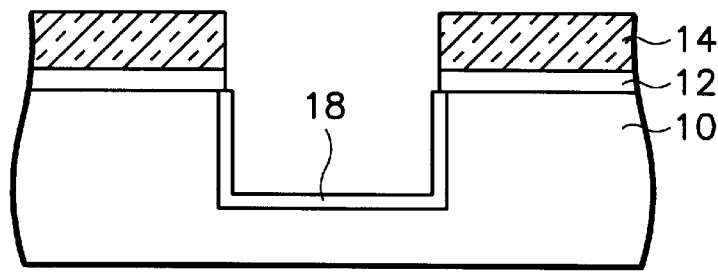

Referring to FIG. 4C, a thermal oxidation process is then conducted on the trench 16, thereby forming a thermal oxide layer 18 along the bottom an sidewalls of the trench 16. The thermal oxide layer 18 is a silicon oxide layer and preferably has a thickness of about 100 Å to 500 Å.

Figure 5A:
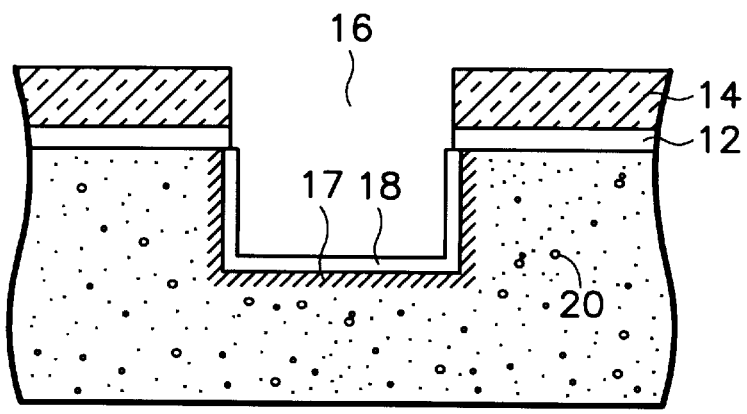
FIG. 5A and FIG. 5B are cross-sectional views or a preferred embodiment of a trench isolation respectively showing a semiconductor substrate before and after a heat treatment.
Figure 5B:
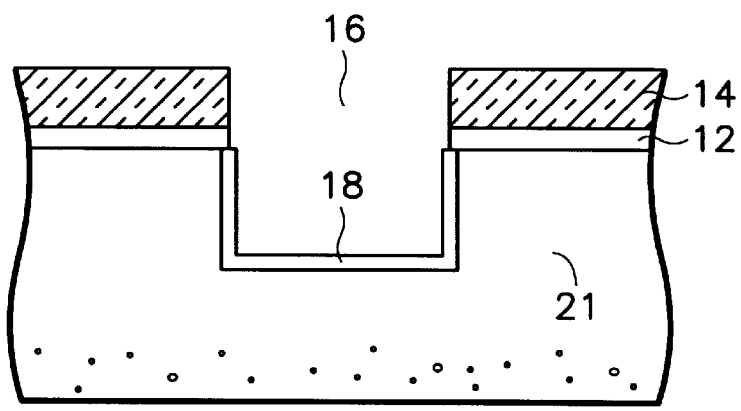

FIG. 5A and FIG. 5B are cross-sectional views respectively showing a semiconductor substrate before and after a heat treatment.

Referring to FIG. 5A, the semiconductor substrate 10 having the thermal oxide layer 18 formed in the trench 16 has a damaged layer 17 resulting from the aforementioned step of etching the semiconductor substrate 10 and oxygen impurities 20 within the semiconductor substrate 10. The oxygen impurities 20 remain in the semiconductor substrate 10 when the semiconductor substrate 10 is fabricated.

The next process sequence is critical this invention. A first heat treatment process is conducted on the semiconductor substrate 10. The first heat treatment process is performed at temperature range from about 1000° C. to 1200° C. for about 1 to 8 hours in an inactive gas ambient, for example pure nitrogen and pure argon. As a result, the damaged layer 17 is cured and the oxygen impurities 20 remaining within the semiconductor substrate 10 are removed, thereby forming a denuded zone 21, i.e., oxygen free zone, as shown in FIG. 5B.

Figure 4D:
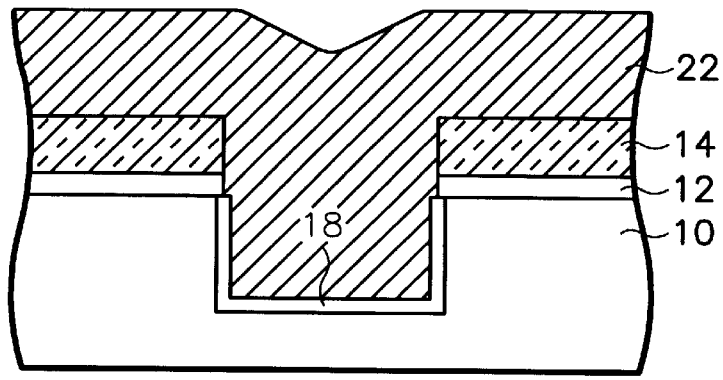

Referring to FIG. 4D, a CVD (chemical vapor deposition) oxide layer 22 is then deposited over the semiconductor substrate 10 to overfill the trench 16, and a second heat treatment process for densifying (hereinafter referred to "densifying process") the CVD oxide layer 22 is performed so as to reduce its etching rate in an inactive gas ambient.

The densifying of the CVD oxide layer 22 can be performed at temperature about 1000° C. to 1050° C., relatively low compared with the first heat treatment process, since the damaged layer 17 has been previously cured through the first heat treatment process at a temperature about 1000° C. to 1200° C.

Therefore, distortions of the semiconductor substrate 10 which are produced during the conventional densifying of the CVD oxide layer can be avoided, thereby preventing degrading characteristics of a subsequent gate oxide layer.

Figure 4E:
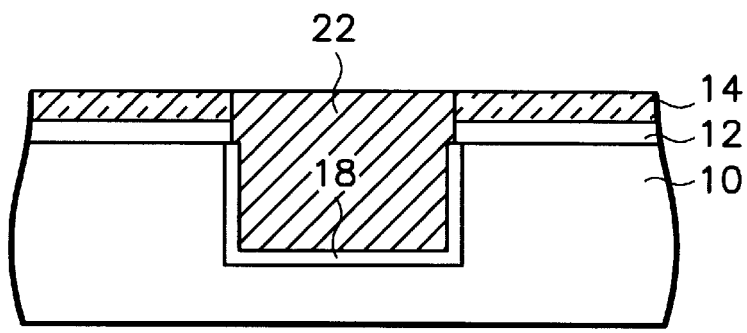

Referring to FIG. 4E, a planarization process such as a CMP (chemical mechanical polish) and a dry etch back is conducted on the device to planarize the CVD oxide layer 22. At this time, the silicon nitride layer 14 serves as an etching stopping layer.

Figure 4F:
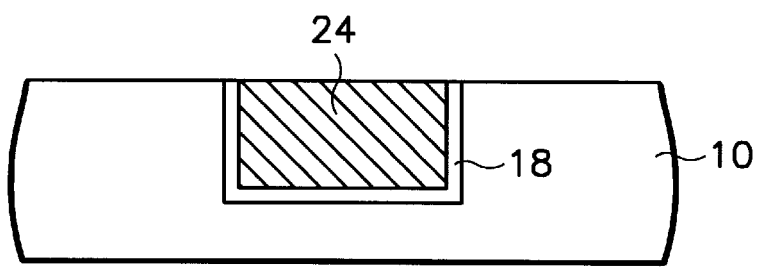

Referring to FIG. 4F, the silicon nitride layer 14 and the silicon oxide layer 12 are then removed, along with adjacent portions of the CVD oxide layer, until an upper surface of the semiconductor substrate 10 is exposed, thereby forming a trench isolation 24.

Figure 6:
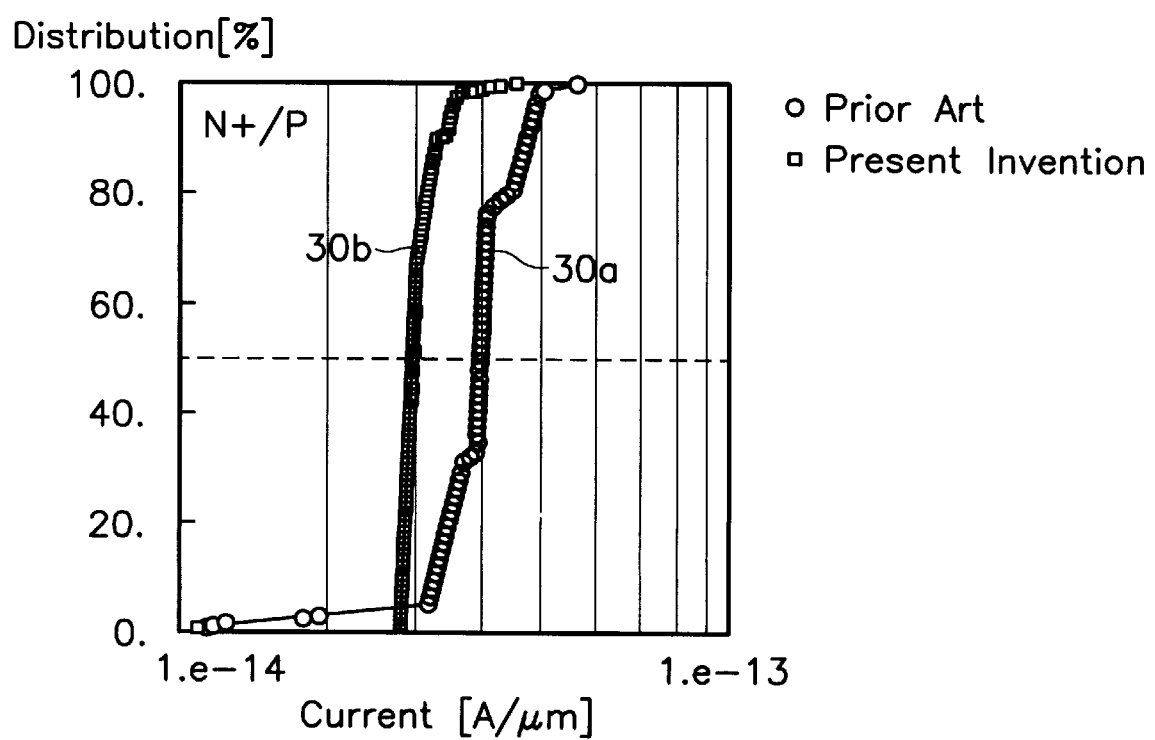
FIG. 6 to FIG. 8 are graphs showing the relationship between the current leakage and the distribution respectively in $n^+/p$, $n^-/p$ and $p^+/n$ junctions measured at temperature about 83° C., in accordance with a preferred embodiment of the present invention.
Figure 7:
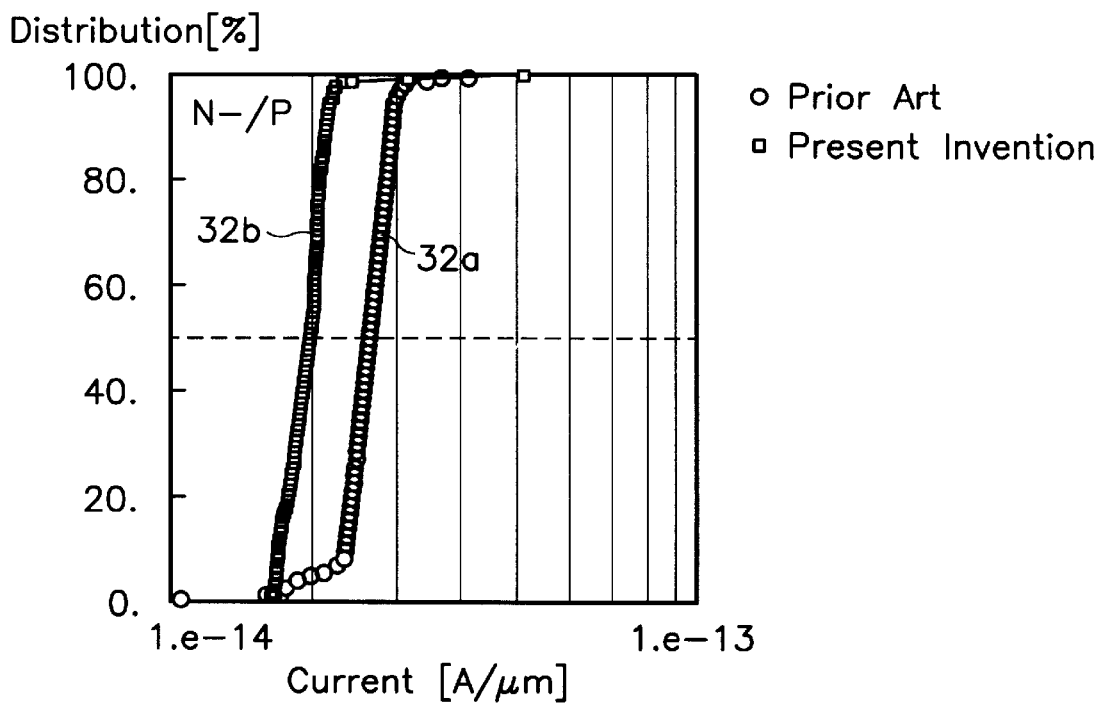
Figure 8:
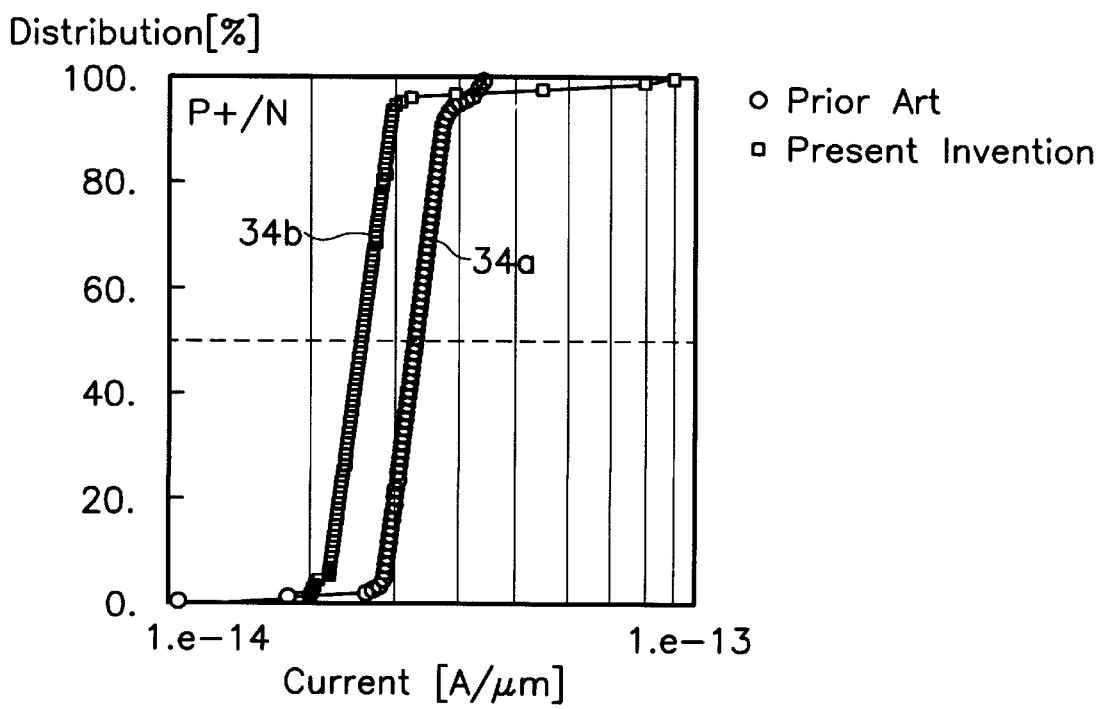

FIG. 6 to FIG. 8 are graphs showing the relationship between the current leakage and the distribution respectively in $n^+/p$, $n^-/p$ and $p^+/n$ junctions measured at a temperature of about 83° C. in accordance with one embodiment of present invention, under the condition that the first heat treatment process is conducted on the semiconductor substrate 10 having about 240 Å thick—thermal oxide layer 18 on the trench 16 at a temperature of about 1150° C. for about one hour in a pure nitrogen ambient atmosphere and then a second heat treatment on the CVD oxide layer 22 at about 1050° C.

Note that the present invention employs the first heat treatment at about 1000° C. to 1200° C. before performing the second heat treatment for densifying the CVD oxide layer at about 1000° C. to 1050° C., while the conventional method does not perform the first heat treatment.

In FIG. 6 to FIG. 8, the circles 30a, 32a, and 34a show the relationship between the current leakage and the distribution in accordance with the conventional method under the condition that densifying the CVD oxide layer is performed at temperature about 1050° C. The squares 30b, 32b and 34b show the relationship between the current leakage and the distribution in accordance with the present invention under the condition that the first heat treatment is performed at a temperature of about 1150° C. and then the second heat treatment for densifying the CVD oxide layer is performed at temperature of about 1050° C.

Referring to FIG. 6, in case of an $n^+/p$ junction, the distribution of the mean current leakage (50%) in accordance with the present invention is about $3 \times 10^{-14}$ A/$\mu$m, as illustrated by the square 30b. On the other hand, the distribution of the mean current leakage (50%) in accordance with the conventional method is about $4 \times 10^{-14}$ A/$\mu$m, as illustrated by the circles 30a.

Referring to FIG. 7, in case of an $n^-/p$ junction, the distribution of the mean current leakage (50%) in accordance with the present invention is about $2 \times 10^{-14}$ A/$\mu$m, as illustrated by the squares 32b. On the other hand, the distribution of the mean current leakage (50%) in accordance with the conventional method is about $2.7 \times 10^{-14}$ A/$\mu$m, as illustrated by the circles 32a.

Referring to FIG. 8, in case of a $p^+/n$ junction, the distribution of the mean current leakage (50%) in accordance with the present invention is about $2.5 \times 10^{-14}$ A/$\mu$m, as illustrated by the squares 34b. On the other hand, the distribution of the mean current leakage (50%) in accordance with the conventional method about is $3.3 \times 10^{-14}$ A/$\mu$m, as illustrated by the circles 34a.

We should give attention to the fact that the first heat treatment process is performed at a high temperature of about 1000° C. to 1200° C. before the CVD oxide layer 22 is formed. Therefore, as mentioned previously, the damaged layer 17 can be cured and the denuded zone 21, free of oxygen impurities, can be formed, thereby reducing the junction current leakage.

Further, the second heat treatment for densifying the CVD oxide layer 22 is performed at temperature 1000° C. to 1050° C., relatively low compared with the first heat treatment, thereby preventing the distortions of the semiconductor substrate 10.

While this invention has been particularly shown and described with reference to the preferred embodiments thereof, it will be understood by those skilled in the art that various changes in form and details may be made without departing from the spirit and scope of this invention.

What is claimed is:

1. A method for forming a trench isolation in a semiconductor device comprising the steps of:

etching a semiconductor substrate to form a trench;

forming a thin thermal oxide layer in the trench;

performing a first heat treatment process to remove semiconductor substrate defects and oxygen impurities from the semiconductor substrate; and filling the trench with an insulating layer to form a device isolation region.

2. A method for forming a trench isolation as recited in claim 1, wherein the trench has a thickness of about 0.1 $\mu$m to 1 $\mu$m.

3. A method for forming a trench isolation as recited in claim 1, wherein the thermal oxide layer has a thickness of about 100 Å to 500 Å.

4. A method for forming a trench isolation as recited in claim 1, wherein the first heat treatment process is performed at a temperature within the range of about 1000° C. to 1200° C. for a duration of about 1 to 8 hours.

5. A method for forming a trench isolation as recited in claim 1, wherein the first heat treatment process is performed in a pure nitrogen ambient atmosphere.

6. A method for forming a trench isolation as recited in claim 1, wherein the first heat treatment process is performed in a pure argon ambient atmosphere.

7. A method for forming a trench isolation as recited in claim 1, further comprising the steps, performed before the step of forming the trench, of:

sequentially forming silicon oxide and silicon nitride layers over the thin thermal oxide layers;

forming a photo-resist layer pattern over the silicon oxide and silicon nitride layers, the photo-resist layer defining a device isolation region on the silicon nitride layer; and removing the silicon nitride and silicon oxide layers using the photo-resist layer pattern to expose portions of the semiconductor substrate.

8. A method for forming a trench isolation as recited in claim 7, wherein the silicon oxide layer has a thickness of about 50 Å to 300 Å.

9. A method for forming a trench isolation as recited in claim 7, wherein the silicon nitride layer has a thickness of about 500 Å to 3000 Å.

10. A method for forming a trench isolation as recited in claim 1, wherein the step of forming the device isolation region further comprises the steps of:

forming a CVD oxide layer over the semiconductor substrate to fill up the trench;

performing a second heat treatment process to densify the CVD oxide layer; and planarizing the CVD oxide layer.

11. A method for forming a trench isolation as recited in claim 10, wherein the second heat treatment process is performed at temperature in the range of about 1000° C. to 1050° C.

12. A method for forming a trench isolation in a semiconductor device, comprising:

etching a semiconductor substrate to form a trench;

forming a thin thermal oxide layer on the bottom and sidewalls of the trench;

performing a first heat treatment process on the semiconductor substrate;

filling the trench with an insulating layer to form a device isolation region;

forming a CVD oxide layer over the semiconductor substrate to fill up the trench;

performing a second heat treatment process on the semiconductor substrate and the CVD oxide layer; and planarizing the CVD oxide layer, wherein the first heat treatment process is performed at a temperature within the range of about 1000° C. to 1200° C. for a duration of about 1 to 8 hours.

13. A method for forming a trench isolation in a semiconductor device, comprising:

etching a semiconductor substrate to form a trench;

forming a thin thermal oxide layer on the bottom and sidewalls of the trench;

performing a first heat treatment process on the semiconductor substrate;

filling the trench with an insulating layer to form a device isolation region;

forming a CVD oxide layer over the semiconductor substrate to fill up the trench;

performing a second heat treatment process on the semiconductor substrate and the CVD oxide layer; and planarizing the CVD oxide layer, wherein the first heat treatment process is performed in a pure argon ambient atmosphere.

* * * * *